(12) United States Patent
Chen et al.

(10) Patent No.: US 12,158,308 B2
(45) Date of Patent: Dec. 3, 2024

(54) HEAT DISSIPATION DEVICE

(71) Applicant: AURAS TECHNOLOGY CO., LTD., New Taipei (TW)

(72) Inventors: Chih-Wei Chen, New Taipei (TW); Tien-Yao Chang, New Taipei (TW); Che-Wei Kuo, New Taipei (TW); Hsiang-Chih Chuang, New Taipei (TW); Jyun-Wei Huang, New Taipei (TW); Kang-Ming Fan, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 50 days.

(21) Appl. No.: 17/811,257

(22) Filed: Jul. 7, 2022

(65) Prior Publication Data

US 2023/0065137 A1 Mar. 2, 2023

(30) Foreign Application Priority Data

Sep. 2, 2021 (TW) ................... 110132655

(51) Int. Cl.
*F28D 15/02* (2006.01)
*F28D 15/04* (2006.01)
*H05K 7/20* (2006.01)

(52) U.S. Cl.
CPC ..... *F28D 15/0266* (2013.01); *F28D 15/0233* (2013.01); *F28D 15/0275* (2013.01); *F28D 15/046* (2013.01); *H05K 7/20336* (2013.01)

(58) Field of Classification Search
CPC ............. F28D 15/0266; F28D 15/0233; F28D 15/0275; F28D 15/046; H05K 7/20336; G06F 2200/201; G06F 2200/203; G06F 1/1656; G06F 1/1681; G06F 1/1616; G06F 1/203; Y02D 10/00
USPC .......................................... 165/185
See application file for complete search history.

(56) References Cited

U.S. PATENT DOCUMENTS

| | | | | |
|---|---|---|---|---|
| 9,182,794 | B2 * | 11/2015 | Rivera | G06F 1/1681 |
| 10,785,893 | B1 * | 9/2020 | Kuo | G06F 1/206 |
| 10,856,441 | B1 * | 12/2020 | Huang | H05K 7/20727 |
| 11,320,876 | B1 * | 5/2022 | North | G06F 1/166 |
| 11,339,594 | B2 * | 5/2022 | Regimbal | G06F 1/1681 |
| 2008/0130221 | A1 * | 6/2008 | Varadarajan | G06F 1/203 |
| | | | | 361/679.52 |
| 2017/0347489 | A1 * | 11/2017 | Lan | F28D 15/0233 |

(Continued)

FOREIGN PATENT DOCUMENTS

WO WO-2020000077 A1 * 1/2020
WO WO-2021249970 A1 * 12/2021 .............. F21V 29/51

*Primary Examiner* — Len Tran
*Assistant Examiner* — Gustavo A Hincapie Serna
(74) *Attorney, Agent, or Firm* — Amin, Turocy & Watson, LLP (57) ABSTRACT

A heat dissipation device is provided and includes: a first vapor chamber filled with a first working fluid therein and used for contacting at least one heat source; at least one heat transfer structure disposed on a side of the first vapor chamber; and a second vapor chamber filled with a second working fluid therein and connected to the first vapor chamber via the heat transfer structure, where the first working fluid absorbs heat of the heat source and then vaporizes, and the vaporized first working fluid transfers the heat to the second working fluid via the heat transfer structure.

18 Claims, 6 Drawing Sheets

(56) References Cited

U.S. PATENT DOCUMENTS

| | | | | |
|---|---|---|---|---|
| 2018/0329464 A1* | 11/2018 | Lin | .................. | G06F 1/1681 |
| 2019/0041138 A1* | 2/2019 | Tseng | .................. | F28D 15/0233 |
| 2019/0254194 A1* | 8/2019 | Paavola | .............. | F28D 15/0208 |
| 2019/0317578 A1* | 10/2019 | North | ...................... | G06F 1/206 |
| 2019/0339020 A1* | 11/2019 | Tseng | .................. | F28D 15/043 |
| 2020/0018555 A1* | 1/2020 | Lin | .................... | F28D 15/0275 |
| 2020/0248968 A1* | 8/2020 | Chen | .................. | F28D 15/04 |
| 2020/0355444 A1* | 11/2020 | Chen | .................. | F28D 15/0283 |
| 2021/0018273 A1* | 1/2021 | Chen | .................... | F28D 15/046 |
| 2022/0075409 A1* | 3/2022 | Yang | .................. | G06F 1/1616 |
| 2022/0155023 A1* | 5/2022 | Wang | ...................... | F28F 3/12 |
| 2022/0205731 A1* | 6/2022 | Toth | .................. | F28D 15/0275 |
| 2022/0304189 A1* | 9/2022 | Luo | ...................... | G06F 1/1681 |
| 2022/0400581 A1* | 12/2022 | Wang | ................ | H05K 7/20336 |
| 2023/0012170 A1* | 1/2023 | Lin | ...................... | H01L 23/427 |
| 2023/0047466 A1* | 2/2023 | Jiang | ................ | F28D 15/0266 |
| 2023/0069684 A1* | 3/2023 | Kitamura | ................ | G06F 1/203 |
| 2023/0337406 A1* | 10/2023 | Bawa | .................. | H05K 7/2099 |

* cited by examiner

HEAT DISSIPATION DEVICE

BACKGROUND

1. Technical Field

The present disclosure relates to a heat dissipation device for a notebook computer.

2. Description of Related Art

In the face of modernization, computers and various other electronic devices have seen rapid developments and continuously improved performance. However, along with these improvements, heat dissipation has become one of the major issues faced by high performance hardware today. In general, computers and various electronic devices employ heat dissipation elements for dissipating the heat away. For example, a thermal paste or heat sinks can be attached onto an electronic element to be dissipated in order to absorb and disperse heat generated by the electronic element. However, heat dissipation effect provided by this type of heat dissipation method is rather limited. Heat dissipation elements that use phase changes of working fluids for heat transfer have thus been developed.

The abovementioned heat dissipation elements achieve the heat transfer by the phase change and flow direction of the working fluid, but the existing heat dissipation elements can only be simply attached onto a single electronic element to be dissipated, and cannot be applied onto two electronic elements that are relatively rotated and must be dissipated (such as a motherboard where the keyboard of the notebook computer is located and a screen), so that the heat energy generated by the motherboard of the notebook computer can only be dissipated in the same mechanism space where the heat energy is located. However, it cannot relatively transfer its heat energy to another mechanism space (such as a screen) for heat dissipation, resulting in a limited overall heat dissipation effect.

Therefore, how to provide a heat dissipation device that can solve the above problems is one of the issues that the industry needs to overcome urgently.

SUMMARY

The present disclosure provides a heat dissipation device, which comprises: a first vapor chamber having a first cavity therein and in contact with at least one heat source, wherein the first cavity is filled with a first working fluid; at least one heat transfer structure disposed on a side of the first vapor chamber; and a second vapor chamber having a second cavity therein and connected to the first vapor chamber via the heat transfer structure, wherein the second cavity is filled with a second working fluid, wherein the first working fluid absorbs heat of the heat source and vaporizes, and the vaporized first working fluid transfers the heat to the second working fluid via the heat transfer structure.

In the aforementioned heat dissipation device, the first vapor chamber comprises: an upper plate; a lower plate combined with the upper plate to form the first cavity, and at least one opening being formed on a side of the lower plate to communicate with the first cavity; at least one heat pipe connected to the opening; at least one liquid channel formed in the first cavity; and at least one flow guiding structure formed on the liquid channel in the first cavity for guiding the first working fluid to flow between the heat source and the heat pipe.

In the aforementioned heat dissipation device, the heat pipe has an open end and a closed end located at two opposite ends thereof, and the heat pipe has a hollow portion inside, wherein the open end is used to communicate with the hollow portion and the opening, such that the hollow portion and the first cavity are communicated with each other.

In the aforementioned heat dissipation device, the flow guiding structure comprises at least one first capillary structure, wherein the at least one first capillary structure is disposed in the first cavity, extends from a periphery of the heat source toward a direction of the heat pipe, and extends into the hollow portion via the open end.

In the aforementioned heat dissipation device, the first capillary structure is a bar-shaped structure made of fibers or metal meshes.

In the aforementioned heat dissipation device, the flow guiding structure comprises a plurality of second capillary structures, wherein the plurality of second capillary structures extend from a periphery of the heat source toward a direction of the heat pipe, and guide the first working fluid in a capillary manner.

In the aforementioned heat dissipation device, the plurality of second capillary structures are bar-shaped particle sintered bodies.

In the aforementioned heat dissipation device, the flow guiding structure comprises a plurality of metal blocks, wherein the plurality of metal blocks extend from a periphery of the heat source toward a direction of the heat pipe, and guide the first working fluid in a blocking manner.

In the aforementioned heat dissipation device, the liquid channel comprises a first liquid channel and a second liquid channel, wherein the first liquid channel is disposed on an inner surface of the lower plate, and the second liquid channel is disposed on an inner surface of the upper plate.

In the aforementioned heat dissipation device, the first liquid channel and the second liquid channel are respectively a particle sintered body, a metal mesh body, a groove, or a combination thereof.

In the aforementioned heat dissipation device, the first vapor chamber further comprises a plurality of third capillary structures, wherein the plurality of third capillary structures are disposed between the first liquid channel and the second liquid channel and are in contact with the first liquid channel and the second liquid channel, thereby allowing the first working fluid to flow between the first liquid channel and the second liquid channel.

In the aforementioned heat dissipation device, a part of the plurality of third capillary structures is correspondingly disposed at the heat source in an array manner.

In the aforementioned heat dissipation device, the plurality of third capillary structures are cylindrical particle sintered bodies.

In the aforementioned heat dissipation device, the heat transfer structure comprises a heat transfer member and a clip member, wherein the heat transfer member contacts the heat pipe and the second vapor chamber at a same time, such that the heat absorbed by the vaporized first working fluid in the heat pipe is transferred to the second working fluid, and wherein the clip member is used for fixing the heat pipe on the heat transfer member.

In the aforementioned heat dissipation device, the heat transfer member has a first block body, a second block body and a support body connecting the first block body and the second block body, wherein a surface of the first block body has a groove for disposing the heat pipe thereon and enabling the heat pipe to rotate relative to the heat transfer member, wherein the second block body is disposed on the second vapor chamber, and wherein the first block body, the second block body and the support body have a clip space formed therebetween.

In the aforementioned heat dissipation device, the clip member has a bending portion and two clip portions, wherein the bending portion is attached to a surface of the heat pipe, and wherein the two clip portions are respectively formed at two ends of the bending portion, extend into the clip space, and are attached onto the first block body.

In the aforementioned heat dissipation device, the heat transfer member and the heat pipe have a heat transfer medium coated therebetween.

In the aforementioned heat dissipation device, the second vapor chamber comprises: two plate members combined to form a second cavity; at least one liquid channel formed on an inner surface of one of the two plate members; and a plurality of capillary structures formed on the liquid channel, extending from a middle of the two plate members to a direction of the heat transfer structure in an arc shape, and guiding the second working fluid in a capillary manner.

In the aforementioned heat dissipation device, the liquid channel is a particle sintered body, a metal mesh body, a groove, or a combination thereof.

In the aforementioned heat dissipation device, the plurality of capillary structures are bar-shaped structures made of fibers or metal meshes.

DETAILED DESCRIPTION OF THE EMBODIMENTS

Embodiments of the present disclosure are illustrated with implementations. Other advantages and technical effects of the present disclosure can be readily understood by one with ordinary skills in the art upon reading the disclosure provided herein, and can be used or applied in other different implementations.

Figure 1:
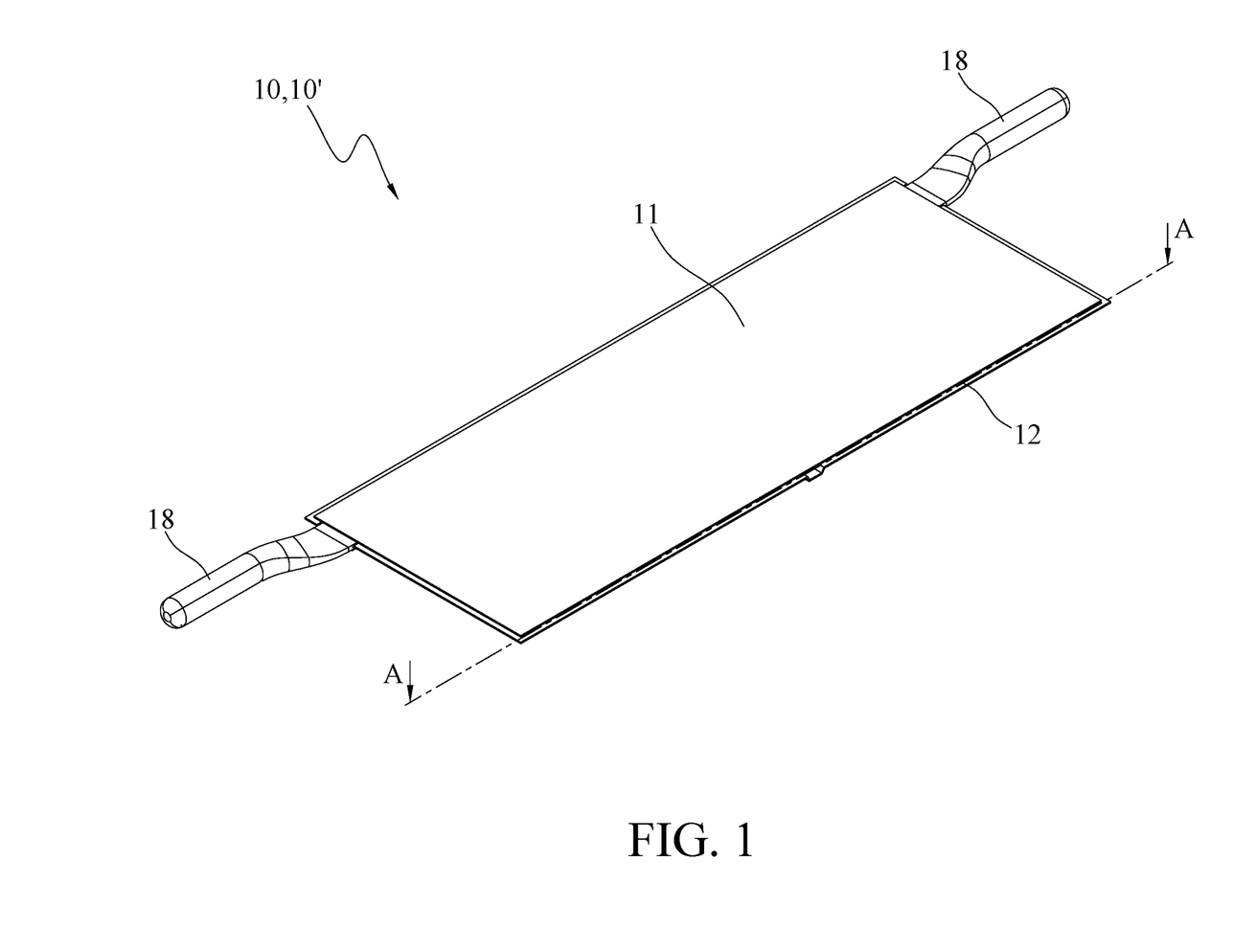
FIG. 1 is a schematic overall view of a vapor chamber according to the present disclosure.
Figure 2:
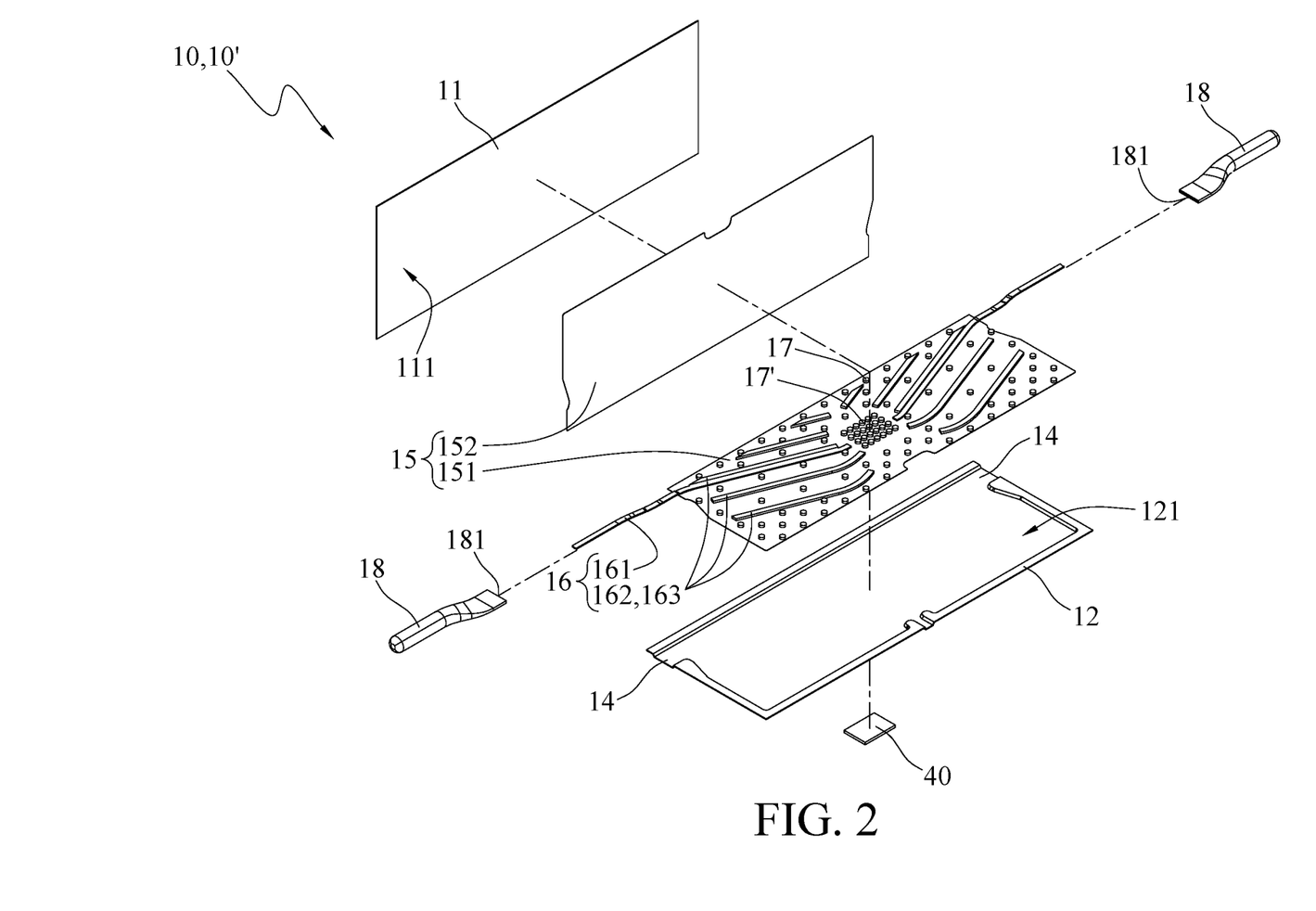
FIG. 2 is a schematic exploded view of the vapor chamber according to the present disclosure.
Figure 3:
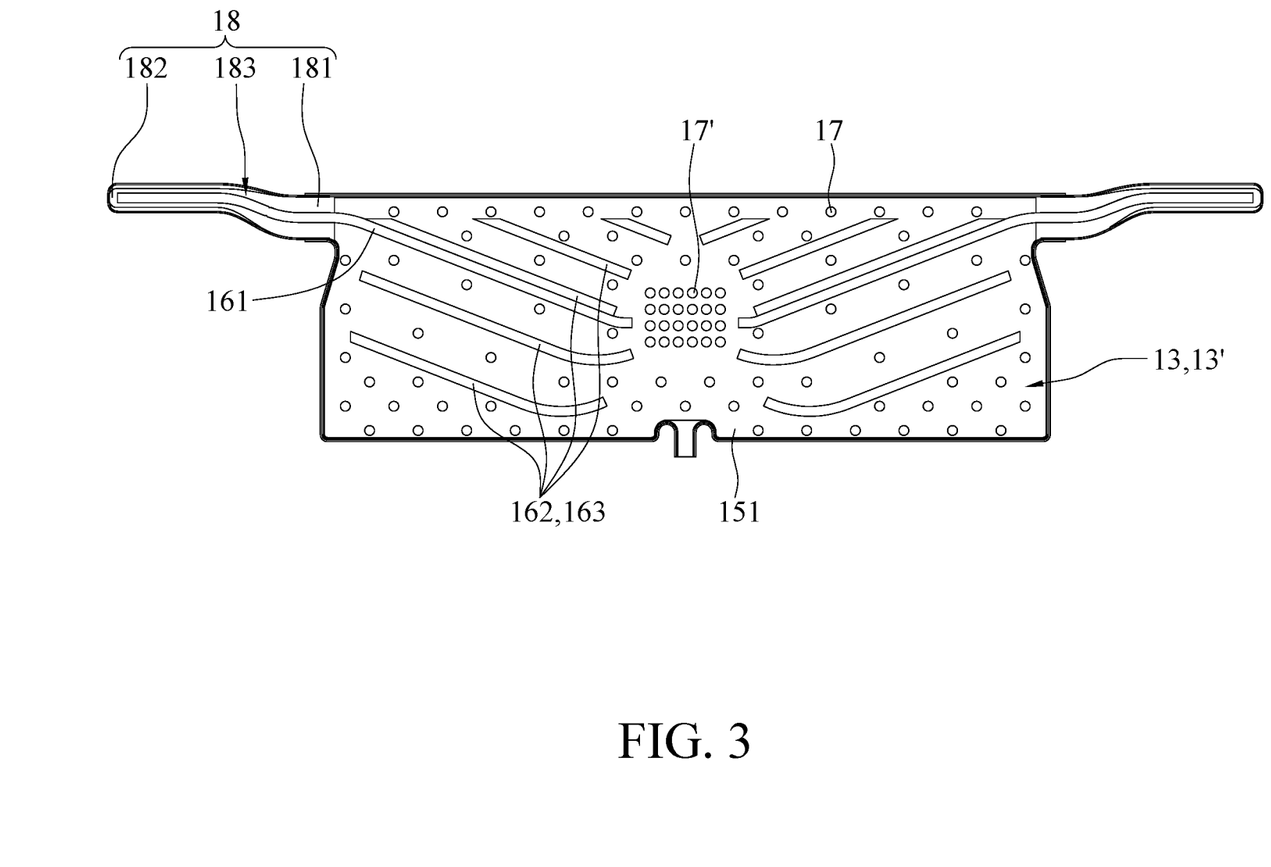
FIG. 3 is a schematic view of a section line A-A in FIG. 1.

Please refer to FIG. 1, FIG. 2 and FIG. 3 at the same time, a vapor chamber 10 of the present disclosure is used for contacting at least one heat source 40, and the vapor chamber 10 includes an upper plate 11, a lower plate 12, at least one heat pipe 18, at least one liquid channel 15 and at least one flow guiding structure 16.

The upper plate 11 has an inner surface 111, and the lower plate 12 also has an inner surface 121. After the upper plate 11 and the lower plate 12 are combined with their inner surfaces 111 and 121 opposite to each other, a cavity (e.g., a chamber) 13 can be formed inside them, and the cavity 13 may be filled with working fluid. In addition, an opening is formed on at least one side of the lower plate 12. In one embodiment, an opening 14 is formed on each of two opposite sides of the lower plate 12, and the opening 14 can communicate with the cavity 13.

In addition, the liquid channel 15 is formed in the cavity 13. For instance, the liquid channel 15 may include a first liquid channel 151 and a second liquid channel 152, the first liquid channel 151 may be provided on the inner surface 121 of the lower plate 12, and the second liquid channel 152 may be provided on the inner surface 111 of the upper plate 11. The liquid channel 15, the first liquid channel 151 and the second liquid channel 152 referred to herein can be regarded as capillary layers for adsorbing the working fluid. For example, the specific structure can be formed by a particle sintered body, a metal mesh body, a groove, or a combination thereof, wherein the particle sintered body refers to a texture or structure with a plurality of capillary pores or connected holes formed by sintering metal powder, the metal mesh body refers to a woven mesh with multiple meshes woven from metal, and the groove refers to the use of wet etching to form a plurality of pillars, wherein gaps between the plurality of pillars can form a plurality of grooves that communicate with each other, so that the working fluid is filled therein, but the present disclosure is not limited to the above.

The heat pipe 18 may be connected to the opening 14. For instance, the heat pipe 18 has an open end 181 and a closed end 182 at two opposite ends thereof, and the heat pipe 18 has a hollow portion 183 inside, the open end 181 can be used to communicate with the hollow portion 183, and the shape of the open end 181 can conform to the opening 14 (e.g., a rectangle), so that the open end 181 can seal the opening 14 at the same time when the open end 181 is disposed in the opening 14, such that the cavity 13 and the hollow portion 183 form a closed space communicating with each other. In addition, the radial cross section of the closed end 182 of the heat pipes 18 can be circular, and the number of the heat pipes 18 can be matched with the number of the openings 14. For example, in an embodiment, the number of the heat pipes 18 and the openings 14 is two, but the present disclosure is not limited to as such.

The flow guiding structure 16 can be formed on the liquid channel 15 in the cavity 13 for guiding the working fluid to flow between the heat source 40 and the heat pipe 18. For instance, the flow guiding structure 16 may include at least one first capillary structure 161 and a plurality of second capillary structures 162. The first capillary structure 161 can be a bar-shaped structure made of fiber or the aforementioned metal mesh, which is arranged in the cavity 13 and extends from the periphery of the heat source 40 toward the direction of the heat pipe 18 and extends to the hollow portion 183 through the open end 181. The second capillary structure 162 also extends from the periphery of the heat source 40 toward the direction of the heat pipe 18, and the second capillary structure 162 may be a bar-shaped particle sintered body. In one embodiment, the first liquid channel 151 and the second capillary structure 162 can be a particle sintered body at the same time and are integrally formed. Therefore, the second capillary structure 162 can guide the working fluid in a capillary manner due to the texture or structure having a plurality of capillary holes or connected holes.

In one embodiment, the flow guiding structure 16 may also include a plurality of metal blocks 163, which extend from the periphery of the heat source 40 toward the direction of the heat pipe 18 to guide the working fluid in different positions of the first liquid channel 151 in a blocking manner, so as to enhance the effect of evenly distributing the working fluid. The flow guiding structure 16 in the vapor chamber 10 of the present disclosure can use only the second capillary structure 162, or only the metal block 163, or both the second capillary structure 162 and the metal block 163 can be used in different positions of the first liquid channel 151, but the present disclosure is not limited to as such.

In one embodiment, the vapor chamber 10 of the present disclosure further includes a plurality of third capillary structures 17, 17', which are disposed between the first liquid channel 151 and the second liquid channel 152 and are in contact with the first liquid channel 151 and the second liquid channel 152, so that the liquid working fluid in the second liquid channel 152 flows to the first liquid channel 151. In one embodiment, the third capillary structures 17, 17' can be cylindrical particle sintered bodies, and can be integrally formed with the first liquid channel 151, but the present disclosure is not limited to as such. In addition, the third capillary structures 17 can be evenly distributed on the first liquid channel 151, and a part of the third capillary structures 17' can be correspondingly disposed on the first liquid channel 151 at the heat source 40 in an array manner, so as to collect more liquid working fluid from the second liquid channel 152 to the top of the heat source 40.

In one embodiment, the operation mode of the vapor chamber 10 of the present disclosure is that the liquid working fluid spread in the cavity 13 is vaporized after absorbing the heat of the heat source 40, so that the vaporized working fluid can flow into the heat pipe 18 via the guidance of the flow guiding structure 16. After the vaporized working fluid in the heat pipe 18 is condensed, it returns to a liquid state. At this time, the liquid working fluid can flow back around the heat source 40 in the cavity 13 via the first capillary structure 161 for the next heat dissipation cycle. In other words, a region where the third capillary structure 17' is provided in the first liquid channel 151 can serve as an evaporation region, and the heat pipe 18 can serve as a condensation region. On the other hand, the second liquid channel 152 can absorb the condensed working fluid (which is returned to liquid state). At this time, the liquid working fluid can flow back around the heat source 40 in the cavity 13 via the third capillary structures 17, 17' or the second capillary structure 162 for the next heat dissipation cycle.

Figure 4:
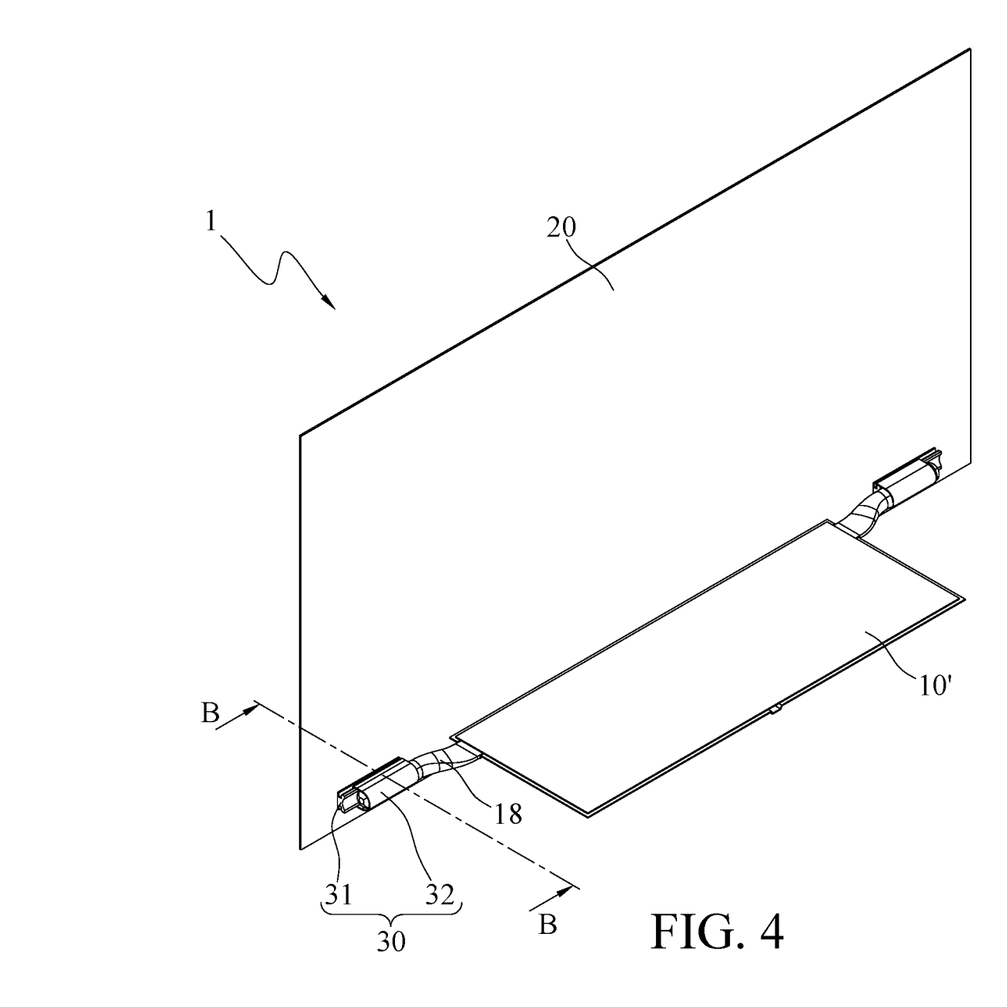
FIG. 4 is a schematic overall view of a heat dissipation device according to the present disclosure.
Figure 5:
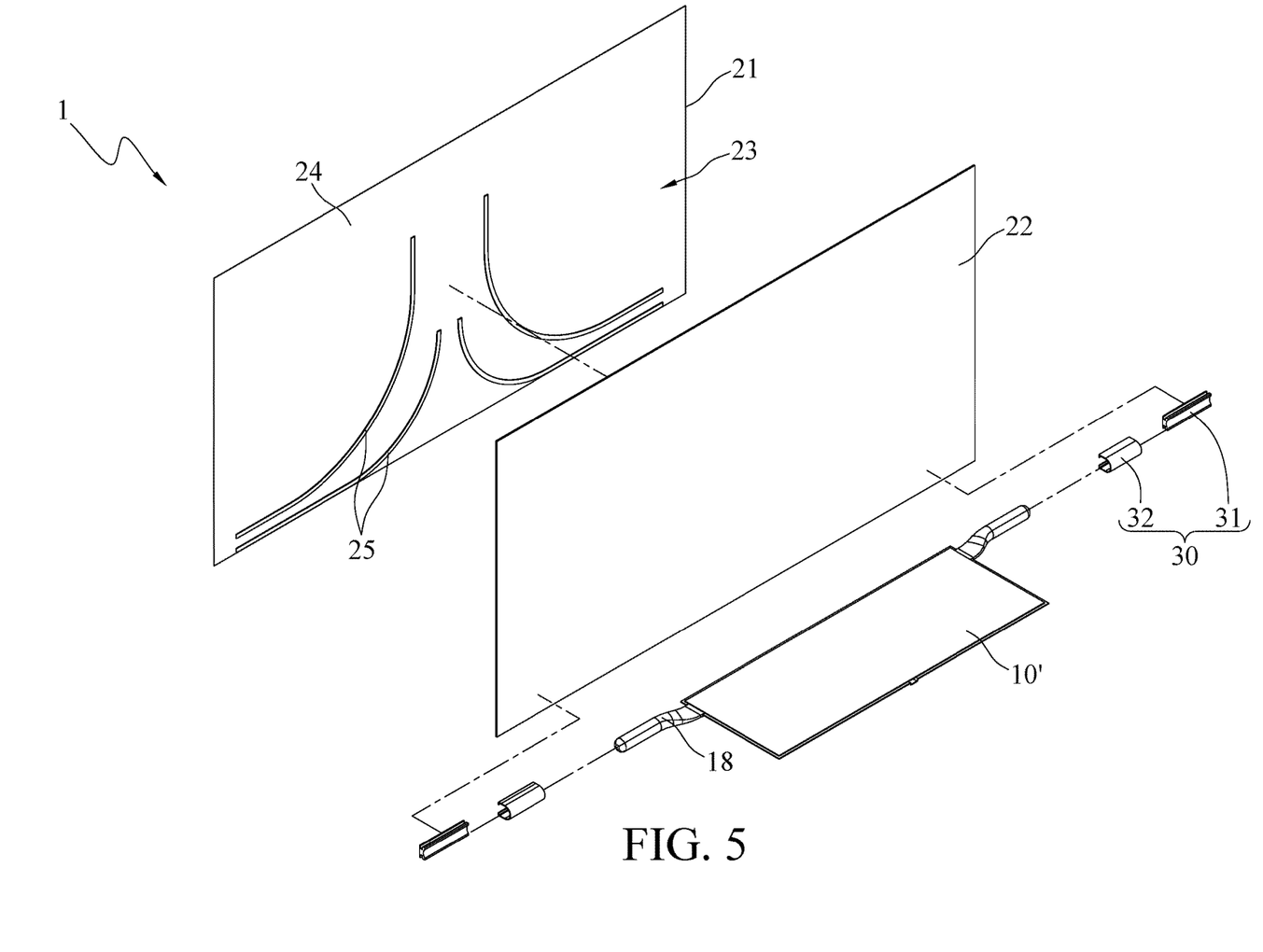
FIG. 5 is a schematic exploded view of the heat dissipation device according to the present disclosure.
Figure 6:
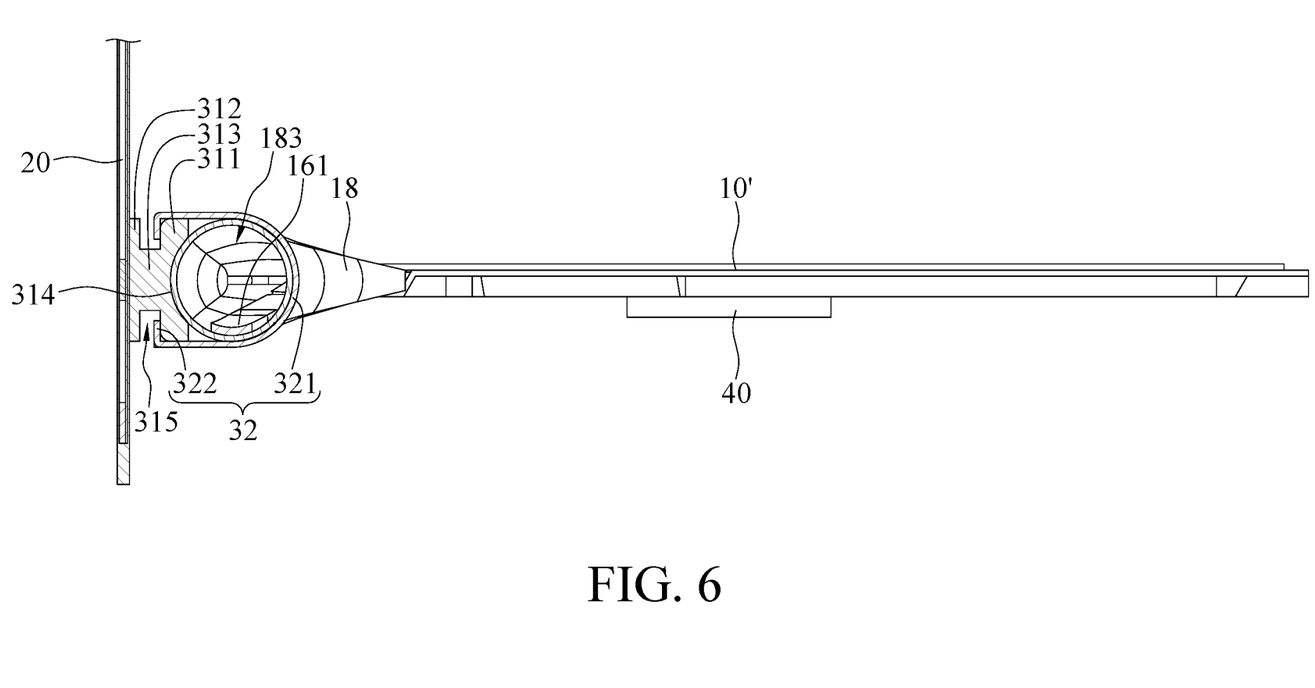
FIG. 6 is a schematic view of a section line B-B in FIG. 4.

Please refer to FIG. 4, FIG. 5 and FIG. 6 at the same time, the present disclosure further provides a heat dissipation device 1, comprising a first vapor chamber 10', at least one heat transfer structure 30 and a second vapor chamber 20, wherein the technical content of the first vapor chamber 10' is the same as that of the vapor chamber 10 described above in FIG. 1 to FIG. 3, and will not be described in detail here.

In an embodiment, the second vapor chamber 20 includes two plate members 21, 22, at least one liquid channel 24 and a plurality of capillary structures 25. After the two plate members 21, 22 are combined, a second cavity 23 can be formed in the interior thereof, and the second cavity 23 can be filled with the second working fluid. The liquid channel 24 can be formed on the inner surface of one of the two plate members 21, 22, or can also be formed on the inner surfaces of the two plate members 21, 22 at the same time, but the present disclosure is not limited to as such. In addition, the liquid channel 24 can also be the same as the aforementioned liquid channel 15, the first liquid channel 151 and the second liquid channel 152, and can be a particle sintered body, a metal mesh body, a groove, or a combination thereof. A plurality of capillary structures 25 are formed on the liquid channel 24, and extend from the middle of the two plate members 21, 22 to the corners of the two plate members 21, 22, for example, extending in an arc shape toward the heat transfer structure 30 installed at the corners of the two plate members 21, 22 and guiding the second working fluid in a capillary manner. In addition, the capillary structures 25 can be the same as the aforementioned first capillary structure 161, which is a bar-shaped structure made of fibers or metal meshes.

In one embodiment, the heat transfer structure 30 is disposed on two opposite sides of the first vapor chamber 10', and at the same time, it is arranged near the corners of the second vapor chamber 20, so that the second vapor chamber 20 can be connected to the first vapor chamber 10' via the heat transfer structure 30. The heat transfer structure 30 may include a heat transfer member 31 and a clip member 32, and the heat transfer member 31 can contact the heat pipe 18 and the second vapor chamber 20 at the same time, wherein the heat transfer member 31 is used for transferring the heat absorbed by the vaporized first working fluid in the heat pipe 18 to the second working fluid, and the clip member 32 is used for fixing the heat pipe 18 on the heat transfer member 31.

In detail, the heat transfer member 31 has a first block body 311, a second block body 312 and a support body 313, and the support body 313 is used to connect the first block body 311 and the second block body 312, wherein the support body 313 has a width less than that of the first block body 311 and the second block body 312, so that the overall structure of the heat transfer member 31 can be an I type or an H type, and a clip space 315 is formed between the first block body 311, the second block body 312 and the support body 313. A surface of the first block body 311 has a groove 314 on which the heat pipe 18 can be disposed, and the second block body 312 is disposed on the second vapor chamber 20. In one embodiment, the groove 314 may conform to the shape of the heat pipe 18, such as an arc-shaped groove, so that after the heat pipe 18 is disposed in the groove 314, the heat pipe 18 can rotate relative to the heat transfer member 31.

The clip member 32 may have a bending portion 321 and two clip portions 322, wherein the bending portion 321 is attached to the surface of the heat pipe 18, and the two clip portions 322 are respectively formed at two ends of the bending portion 321, extend into the clip space 315 and are attached onto the first block body 311, that is, a right angle may be sandwiched between the clip portion 322 and the bending portion 321, but the present disclosure is not limited to as such.

In one embodiment, a heat transfer medium may be coated between the heat transfer member 31 and the heat pipe 18 (e.g., in the groove 314 of the first block body 311), in order to assist the heat absorbed by the vaporized first working fluid in the heat pipe 18 to be more smoothly transferred to the heat transfer element 31, and then transferred from the heat transfer member 31 to the second working fluid in the second vapor chamber 20.

In one embodiment, the operation mode of the heat dissipation device 1 of the present disclosure is that the liquid first working fluid in the first vapor chamber 10' is spread in a first cavity 13' and vaporized after absorbing the heat of the heat source 40, so that the vaporized first working fluid can flow into the heat pipe 18 via the guidance of the flow guiding structure 16. The vaporized first working fluid in the heat pipe 18 can transfer the heat to the heat transfer member 31 in the heat transfer structure 30. At this time, the vaporized first working fluid will be condensed and returned to a liquid state, and the condensed liquid first working fluid can flow back around the heat source 40 in the first cavity 13' via the first capillary structure 161 for the next heat dissipation cycle. In addition, after the heat transfer member 31 absorbs heat, the heat can be absorbed by the liquid second working fluid in the second vapor chamber 20, and the second working fluid can be vaporized. The vaporized second working fluid will be spread to the second vapor chamber 20 for heat dissipation, and the second working fluid after heat dissipation will be condensed and returned to a liquid state, wherein the condensed liquid second working fluid can flow back to a place where the heat transfer structure 30 is connected to the second vapor chamber 20 via a plurality of capillary structures 25, so as to perform the next heat dissipation cycle. In other words, the function of the heat transfer structure 30 is equivalent to the heat source contacted by the second vapor chamber 20, and thus the heat generated by the heat source 40 in contact with the first vapor chamber 10' can be gradually transferred to the second vapor chamber 20 for heat dissipation.

In one embodiment, the material of the above-mentioned vapor chamber 10, the upper plate 11 and the lower plate 12 of the first vapor chamber 10', and the two plate members 21, 22 of the second vapor chamber 20 may be copper, aluminum, stainless steel, dissimilar metals, or combinations thereof, but the present disclosure is not limited to as such.

To sum up, the vapor chamber of the present disclosure can transfer the heat generated by the heat source it contacts to the heat pipe for heat dissipation, and the heat dissipation device composed of the vapor chamber of the present disclosure, another vapor chamber and a heat transfer structure can transfer the heat of the heat source contacted by the vapor chamber to another vapor chamber sequentially via the heat pipe and the heat transfer structure for heat dissipation, so that the overall heat dissipation efficiency can be effectively improved. In addition, in the heat dissipation device of the present disclosure, the vapor chambers are connected by a heat transfer structure, and one vapor chamber can be rotated relative to the other vapor chamber by using the heat transfer structure as a pivot. Therefore, the heat dissipation device of the present disclosure can be effectively applied to two electronic elements that can be relatively rotated and must be dissipated. For example, it is applied to a notebook computer, wherein one vapor chamber is attached to the motherboard where the keyboard is located, and the other vapor chamber is attached to the back of the screen, so as to improve the overall heat dissipation.

The above embodiments are provided for illustrating the principles and technical effects of the present disclosure, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A heat dissipation device, comprising:
    a first vapor chamber having a first cavity therein and in contact with at least one heat source, wherein the first cavity is filled with a first working fluid;
    at least one heat transfer structure disposed on a side of the first vapor chamber; and
    a second vapor chamber having a second cavity therein and connected to the first vapor chamber via the heat transfer structure, wherein the second cavity is filled with a second working fluid,
    wherein the first working fluid absorbs heat of the heat source and vaporizes, and the vaporized first working fluid transfers the heat to the second working fluid via the heat transfer structure,
    wherein the first vapor chamber comprises:
        an upper plate;
        a lower plate combined with the upper plate to form the first cavity, and at least one opening being formed on a side of the lower plate to communicate with the first cavity;
        at least one heat pipe connected to the opening;
        at least one liquid channel formed in the first cavity; and
        at least one flow guiding structure formed on the liquid channel in the first cavity for guiding the first working fluid to flow between the heat source and the heat pipe,
    wherein the heat transfer structure comprises a heat transfer member and a clip member, wherein the heat transfer member contacts the heat pipe and the second vapor chamber at a same time, such that the heat absorbed by the vaporized first working fluid in the heat pipe is transferred to the second working fluid, and wherein the clip member is used for fixing the heat pipe on the heat transfer member.

2. The heat dissipation device of claim 1, wherein the heat pipe has an open end and a closed end located at two opposite ends thereof, and the heat pipe has a hollow portion inside, and wherein the open end is used to communicate with the hollow portion and the opening, such that the hollow portion and the first cavity are communicated with each other.

3. The heat dissipation device of claim 2, wherein the flow guiding structure comprises at least one first capillary structure, and wherein the at least one first capillary structure is disposed in the first cavity, extends from a periphery of the heat source toward a direction of the heat pipe, and extends into the hollow portion via the open end.

4. The heat dissipation device of claim 3, wherein the first capillary structure is a bar-shaped structure made of fibers or metal meshes.

5. The heat dissipation device of claim 1, wherein the flow guiding structure comprises a plurality of second capillary structures, and wherein the plurality of second capillary structures extend from a periphery of the heat source toward a direction of the heat pipe, and guide the first working fluid in a capillary manner.

6. The heat dissipation device of claim 5, wherein the plurality of second capillary structures are bar-shaped particle sintered bodies.

7. The heat dissipation device of claim 1, wherein the flow guiding structure comprises a plurality of metal blocks, and wherein the plurality of metal blocks extends from a periphery of the heat source toward a direction of the heat pipe, and guide the first working fluid in a blocking manner.

8. The heat dissipation device of claim 1, wherein the liquid channel comprises a first liquid channel and a second liquid channel, and wherein the first liquid channel is disposed on an inner surface of the lower plate, and the second liquid channel is disposed on an inner surface of the upper plate.

9. The heat dissipation device of claim 8, wherein the first liquid channel and the second liquid channel are respectively a particle sintered body, a metal mesh body, a groove, or a combination thereof.

10. The heat dissipation device of claim 8, wherein the first vapor chamber further comprises a plurality of third capillary structures, and wherein the plurality of third capillary structures are disposed between the first liquid channel and the second liquid channel and are in contact with the first liquid channel and the second liquid channel, thereby allowing the first working fluid to flow between the first liquid channel and the second liquid channel.

11. The heat dissipation device of claim 10, wherein a part of the plurality of third capillary structures is correspondingly disposed at the heat source in an array manner.

12. The heat dissipation device of claim 10, wherein the plurality of third capillary structures are cylindrical particle sintered bodies.

13. The heat dissipation device of claim 1, wherein the heat transfer member has a first block body, a second block body and a support body connecting the first block body and the second block body, wherein a surface of the first block body has a groove for disposing the heat pipe thereon and enabling the heat pipe to rotate relative to the heat transfer member, wherein the second block body is disposed on the second vapor chamber, and wherein the first block body, the second block body and the support body have a clip space formed therebetween.

14. The heat dissipation device of claim 13, wherein the clip member has a bending portion and two clip portions, wherein the bending portion is attached to a surface of the heat pipe, and wherein the two clip portions are respectively formed at two ends of the bending portion, extend into the clip space, and are attached onto the first block body.

15. The heat dissipation device of claim 1, wherein the heat transfer member and the heat pipe have a heat transfer medium coated therebetween.

16. The heat dissipation device of claim 1, wherein the second vapor chamber comprises:
 two plate members combined to form the second cavity;
 at least one liquid channel formed on an inner surface of one of the two plate members; and
 a plurality of capillary structures formed on the liquid channel, extending from a middle of the two plate members to a direction of the heat transfer structure in an arc shape, and guiding the second working fluid in a capillary manner.

17. The heat dissipation device of claim 16, wherein the liquid channel is a particle sintered body, a metal mesh body, a groove, or a combination thereof.

18. The heat dissipation device of claim 16, wherein the plurality of capillary structures are bar-shaped structures made of fibers or metal meshes.

* * * * *